United States Patent
Melvin, III et al.

(10) Patent No.: US 11,314,171 B2
(45) Date of Patent: Apr. 26, 2022

(54) LITHOGRAPHY IMPROVEMENT BASED ON DEFECT PROBABILITY DISTRIBUTIONS AND CRITICAL DIMENSION VARIATIONS

(71) Applicant: Synopsys, Inc., Mountain View, CA (US)

(72) Inventors: Lawrence S. Melvin, III, Hillsboro, OR (US); Yudhishthir Prasad Kandel, Durham, NC (US); Qiliang Yan, Portland, OR (US); Ulrich Karl Klostermann, Munich (DE)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/032,417

(22) Filed: Sep. 25, 2020

(65) Prior Publication Data
US 2021/0088913 A1  Mar. 25, 2021

Related U.S. Application Data

(63) Continuation of application No. PCT/US2020/052560, filed on Sep. 24, 2020.
(Continued)

(51) Int. Cl.
*G03F 7/20* (2006.01)
*G03F 9/00* (2006.01)

(52) U.S. Cl.
CPC .......... *G03F 7/70441* (2013.01); *G03F 7/705* (2013.01); *G03F 7/70283* (2013.01); *G03F 9/7026* (2013.01)

(58) Field of Classification Search
CPC .. G03F 7/70441; G03F 7/705; G03F 7/70283; G03F 9/7026; G03F 7/70558;
(Continued)

(56) References Cited

U.S. PATENT DOCUMENTS

2008/0183446 A1  7/2008  Hansen
2016/0246168 A1*  8/2016  Ye .......................... G03F 7/705

FOREIGN PATENT DOCUMENTS

TW      201820188 A      6/2018
WO   WO 2018/077787 A1   5/2018
WO   WO 2020/094389 A1   5/2020

OTHER PUBLICATIONS

De Bisschop, P. et al., "Stochastic Printing Failures in EUV Lithography," Proceedings of SPIE, Mar. 26, 2019, 20 pages, vol. 10957.
(Continued)

*Primary Examiner* — Mesfin T Asfaw
(74) *Attorney, Agent, or Firm* — Fenwick & West LLP

(57) ABSTRACT

Certain aspects relate to a method for improving a lithography configuration. In the lithography configuration, a source illuminates a mask to expose resist on a wafer. A processor determines a defect-based focus exposure window (FEW). The defect-based FEW is an area of depth of focus and exposure latitude for the lithography configuration with an acceptable level of defects on the wafer. The defect-based FEW is determined based on a predicted probability distribution for occurrence of defects on the wafer. A processor also determines a critical dimension (CD)-based FEW. The CD-based FEW is an area of depth of focus and exposure latitude for the lithography configuration with an acceptable level of CD variation on the wafer. It is determined based on predicted CDs on the wafer. The lithography configuration is modified based on increasing an area of overlap between the defect-based FEW and the CD-based FEW.

20 Claims, 10 Drawing Sheets
(3 of 10 Drawing Sheet(s) Filed in Color)

Related U.S. Application Data

(60) Provisional application No. 62/907,901, filed on Sep. 30, 2019, provisional application No. 62/905,771, filed on Sep. 25, 2019.

(58) Field of Classification Search
CPC .... G03F 7/70641; G03F 1/36; G03F 7/70433; G03F 7/20; G03F 7/70125; G03F 7/7065; G03F 7/70525; G03F 7/70625; G03F 7/70616; G03F 7/70091; G03F 7/70466; G03F 7/70675; G06F 30/398
See application file for complete search history.

(56) References Cited

OTHER PUBLICATIONS

Maslow, M. J. et al., "Impact of Local Variability on Defect-Aware Process Windows," Proceedings of SPIE, Mar. 26, 2019, 16 pages, vol. 10957.
PCT International Search Report and Written Opinion, PCT Application No. PCT/US2020/052560, dated Feb. 11, 2021, 16 pages.
Taiwan Intellectual Property Office, Office Action, Taiwan Patent Application No. 109133346, dated Aug. 2, 2021, 12 pages.

\* cited by examiner

Mask 610A

Mask 610A

Mask 610C

LITHOGRAPHY IMPROVEMENT BASED ON DEFECT PROBABILITY DISTRIBUTIONS AND CRITICAL DIMENSION VARIATIONS

CROSS-REFERENCE TO RELATED APPLICATION(S)

This application is a continuation of International Application No. PCT/US20/52560, "Lithography Improvement Based on Defect Probability Distributions and Critical Dimension Variations," filed Sep. 24, 2020. This application also claims priority under 35 U.S.C. § 119(e) to U.S. Provisional Patent Application Ser. No. 62/905,771, "Stochastic Window Centering for Semiconductor Process Defect Mode," filed Sep. 25, 2019; and to U.S. Provisional Patent Application Ser. No. 62/907,901, "Stochastic Window Centering for Semiconductor Process Defect Mode," filed Sep. 30, 2019. The subject matter of all of the foregoing is incorporated herein by reference in their entirety.

TECHNICAL FIELD

The present disclosure relates to lithography and, more particularly, to using both predictions of defects and of critical dimensions to improve the lithography process.

BACKGROUND

One step in the manufacture of semiconductor wafers involves lithography. In a typical lithography process, a source produces light that is collected and directed by collection/illumination optics to illuminate a mask. Projection optics relay the pattern produced by the illuminated mask onto a wafer, exposing resist on the wafer according to the illumination pattern. The patterned resist is then used in a process to fabricate structures on the wafer. For a given mask, the lithography equipment may be operated over a range of focus settings and a range of exposure settings while still producing acceptable results. This range is referred to as depth of focus (e.g., focus expressed in nanometers) and exposure latitude (e.g., exposure expressed in millijoules per centimeter squared). The area defined by acceptable depth of focus and exposure latitude is referred to as the focus exposure window (FEW) for that lithography configuration of mask and lithography equipment.

As lithography moves to shorter wavelength ranges (e.g., EUV at approximately 13.3-13.7 nm) and smaller geometries (e.g., 10 nm, 7 nm and smaller technology nodes, with 20 nm, 14 nm and smaller feature sizes), the sensitivity to manufacturing variations increases. For example, higher photon energies result in lower photon counts for equal energy exposure. This can result in stochastic defect mechanisms that were negligible or non-existent at longer wavelengths and larger geometries. Current approaches to lithography optimization may ignore these effects and, therefore, may result in sub-optimal lithography configurations.

SUMMARY

Certain aspects relate to a method for improving a lithography configuration. In the lithography configuration, a source illuminates a mask to expose resist on a wafer. A processor determines a defect-based focus exposure window (FEW). The defect-based FEW is an area of depth of focus and exposure latitude for the lithography configuration with an acceptable level of defects on the wafer. The defect-based FEW is determined based on a predicted probability distribution for occurrence of defects on the wafer. A processor also determines a critical dimension (CD)-based FEW. The CD-based FEW is an area of depth of focus and exposure latitude for the lithography configuration with an acceptable level of CD variation on the wafer. It is determined based on predicted CDs on the wafer. The lithography configuration is modified based on increasing an area of overlap between the defect-based FEW and the CD-based FEW.

Other aspects include components, devices, systems, improvements, methods, processes, applications, computer readable mediums, and other technologies related to any of the above.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to lithography improvement based on defect probability distributions and critical dimension variations. In order to manufacture a semiconductor device, the lithography tools must be able to image in a range of focus settings and exposure settings for a given mask. This range is referred to as depth of focus (e.g., focus measured in nanometers) and exposure latitude (e.g., exposure measured in millijoules per centimeter squared). The depth of focus and exposure latitude define a two-dimensional space. The lithography tools will meet requirements for critical dimensions (CDs) on the wafer over a certain area of that space. That area may be referred to as the process window or focus exposure window (FEW). In addition, random pattern failures resulting from stochastic variations in the lithography process are also impacted by the depth of focus and exposure latitude. Thus, there are two FEWs: one based on CD variations (CD-based process window) and one based on the probability of defects occurring (defect-based process window).

In typical design approaches, these two process windows may not have a large area of overlap. For example, if stochastic variations are assumed to be negligible or are otherwise ignored, then the defect-based process window will not be considered in the design process. The resulting design may have a defect-based process window that does not overlap significantly with the CD-based process window. This will reduce the overall yield. Conversely, considering both CD variations and defect probability distributions in the design phase can yield lithography configurations with larger overlap between the two process windows, thus providing greater tolerances in operating the lithography equipment and increasing yield.

Figure 1:
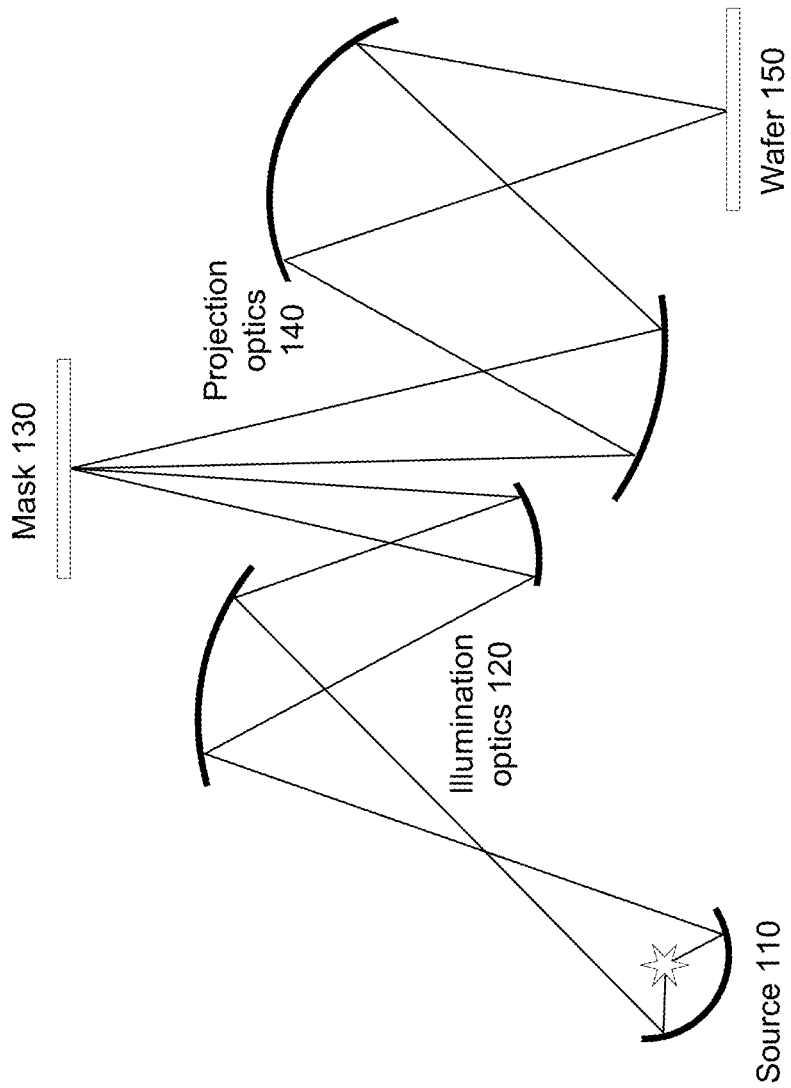
FIG. 1 depicts an EUV lithography system suitable for use with embodiments of the present disclosure.

FIG. 1 depicts an extreme ultraviolet (EUV) lithography system suitable for use with embodiments of the present disclosure. In this system, a source 110 produces EUV light that is collected and directed by collection/illumination optics 120 to illuminate a mask 130. Projection optics 140 relay the pattern produced by the illuminated mask onto a wafer 150, exposing resist on the wafer according to the illumination pattern. The exposed resist is then developed, producing patterned resist on the wafer. This is used to fabricate structures on the wafer, for example through deposition, doping, etching or other processes.

In FIG. 1, the light is in the EUV wavelength range, around 13.5 nm or in the range 13.3-13.7 nm. At these wavelengths, the components typically are reflective, rather than transmissive. The mask 130 is a reflective mask and the optics 120, 140 are also reflective and off-axis. This is just an example. Other types of lithography systems may also be used, including at other wavelengths, using transmissive masks and/or optics, and using positive or negative resist.

Figure 2:
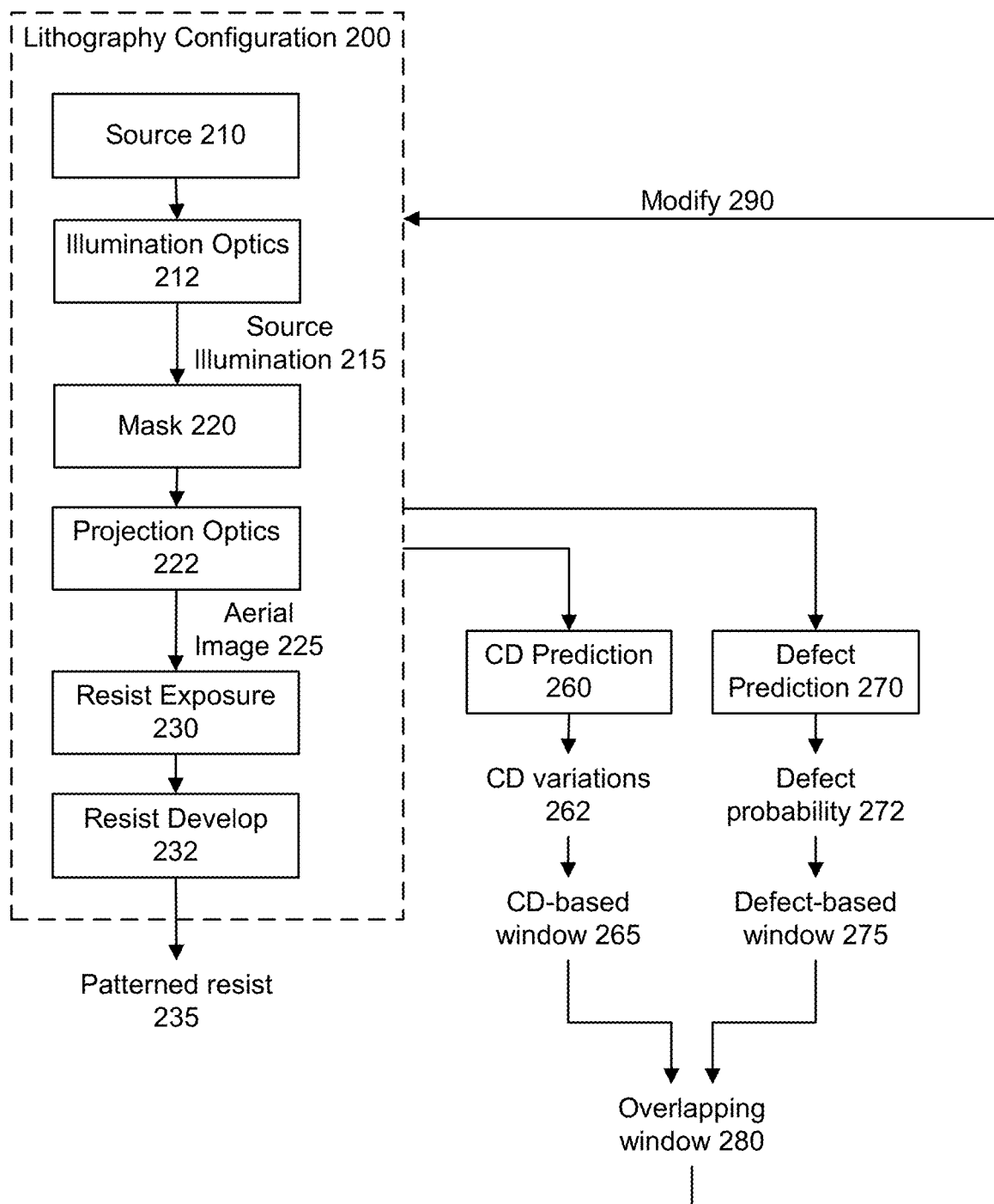
FIG. 2 depicts a flowchart for improving a lithography system based on critical dimension and defect probability models in accordance with some embodiments of the present disclosure.

FIG. 2 depicts a flowchart for improving a lithography system based on critical dimension and defect probability models. The dashed box includes simulations or models of the overall lithography configuration 200. For convenience, separate boxes are shown to correspond to physical components or processes, but the simulations need not be implemented in this way. For example, source 210 represents a model of the source 110 and illumination optics 212 represents the effect of illumination optics 120. These are used to predict the source illumination 215 of the mask. However, actual simulation may or may not use separate models for the source 210 and optics 212. In some cases, the two may be combined into a single model or simulation that predicts the source illumination 215. Mask 220 models the effect of the mask 130 on the incident illumination 215. Projection optics 222 represents the effect of optics 140. The source illumination 215 is filtered by mask 220 and relayed by projection optics 220 to produce the aerial image 225 that exposes the resist on the wafer. The resist is modeled by exposure 230 and development 232, resulting in patterned resist 235. Additional modeling may be used to predict etching, doping, deposition or other semiconductor fabrication processes.

One measure of the quality of patterned resist 235 is the critical dimension (CD). CD is the dimension of important features in the patterned resist. Typically, the CD is the smallest line width or space width printed in the resist. As such, it is a measure of the resolution of the resist and lithography process. The models 200 may be used to predict 260 the CDs for a given lithography configuration. Changes in the lithography configuration 200 will result in changes in the patterned resist 235 and variations 262 in the CD.

Two important operating parameters for a lithography system are exposure and focus. Exposure (or dose) is the amount of energy irradiating the resist. Variations in exposure may be referred to as exposure latitude. Focus refers to the optical alignment of the different components, for example to what extent the projection optics is aligned to perfectly image the mask onto the resist. Variations in focus may be referred to as defocus. Given the models 200, CD variations 262 as a function of exposure latitude and defocus may be predicted. Conversely, values of exposure latitude and defocus which yield acceptable levels of CD variations may also be predicted. This is referred to as the CD-based process window 265.

Another measure of the quality of patterned resist 235 is defects. Examples of defects include when two printed lines that are supposed to be separate are merged, when a printed line that is supposed to be continuous has a break, and when a printed feature that is supposed to have a hole in the center is actually filled in.

The lithography process has stochastic variations. For example, the quality of the resist patterns 235 depends on the uniformity of photon absorption events during exposure and the uniformity of the subsequent photo-chemical reactions in the resist. Photon statistics (e.g., shot noise) become increasingly important as the source photon count output decreases because the number of photon absorption events is one of a chain of stochastic processes in a lithographic process. EUV lithography systems are characterized by both low photon output and low source throughput through the tool. For these reasons, photon shot noise can play a larger role in EUV systems, especially at technology nodes with feature sizes of 14 nm and smaller. Accounting for stochastic processes results in defect prediction 270 that is probabilistic 272 rather than deterministic. For example, simulations may produce a probability distribution for the occurrence of defects on a wafer—a probability of realizing any particular defect or a defectivity rate for the wafer (or portion of a wafer).

Given the ability to predict defect probabilities 272 as a function of exposure latitude and defocus, a defect-based process window 275 may also be determined. This is the values of exposure latitude and defocus which yield acceptable levels of defect probability.

Given the CD-based process window 265 and the defect-based process window 275, the overlap 280 between the two windows may be determined. This represents the useable process window, at least with respect to CD variations and defect probabilities. Even if the two separate process windows 265, 275 are large, if they are shifted relative to each other, then the useable process window 280 will be relatively small. Therefore, the lithography configuration 200 may be modified 290 to improve the area of overlap. In some cases, the area of overlap 280 may be increased by improving the alignment or centering of the two process windows 265, 275 with respect to each other. In other cases, the area of overlap 280 may be increased by increasing the area of one or both process windows 265, 275.

Figure 3:
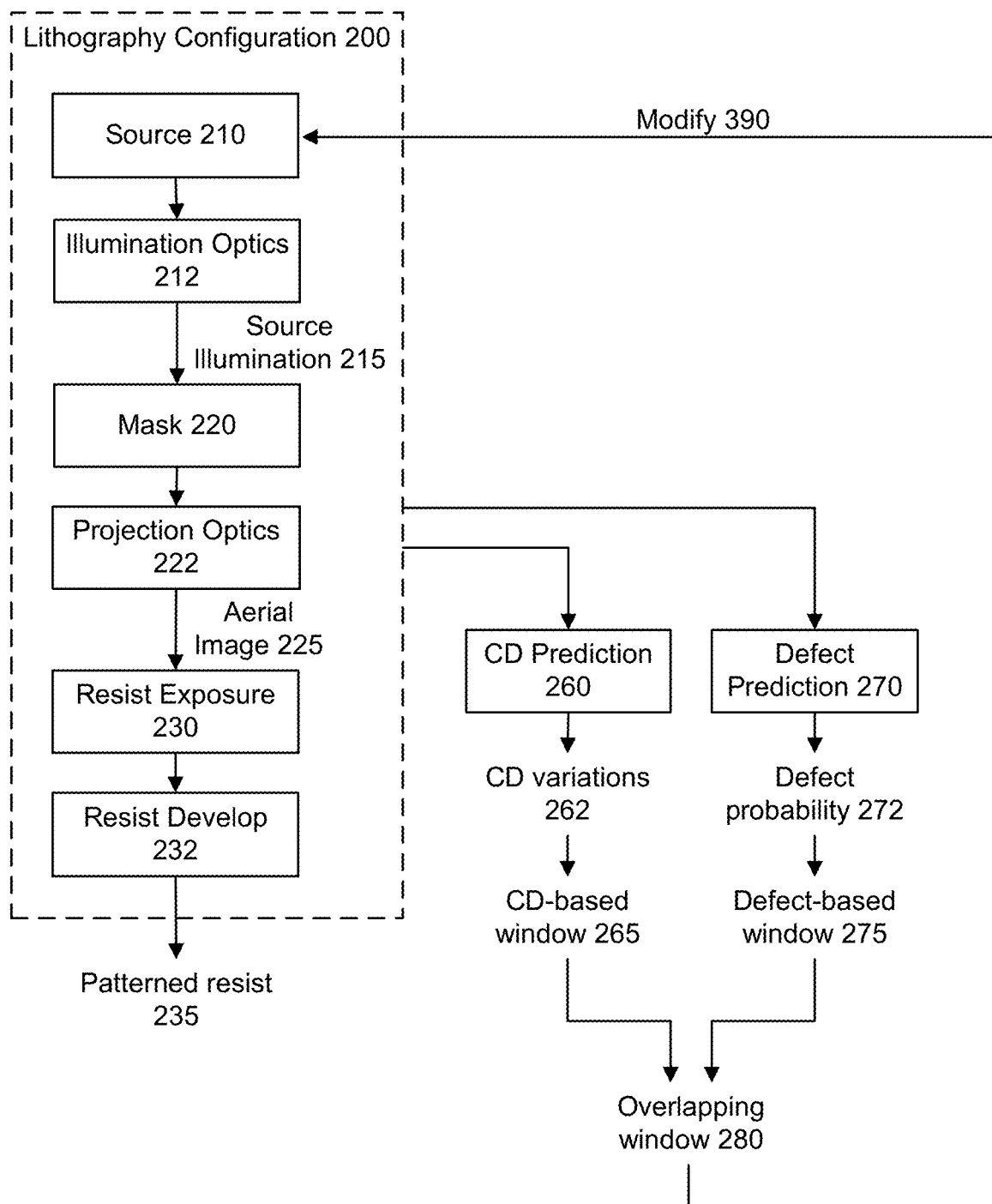
FIG. 3 depicts a flowchart for improving a lithography system based on optimizing a source.
Figure 4:
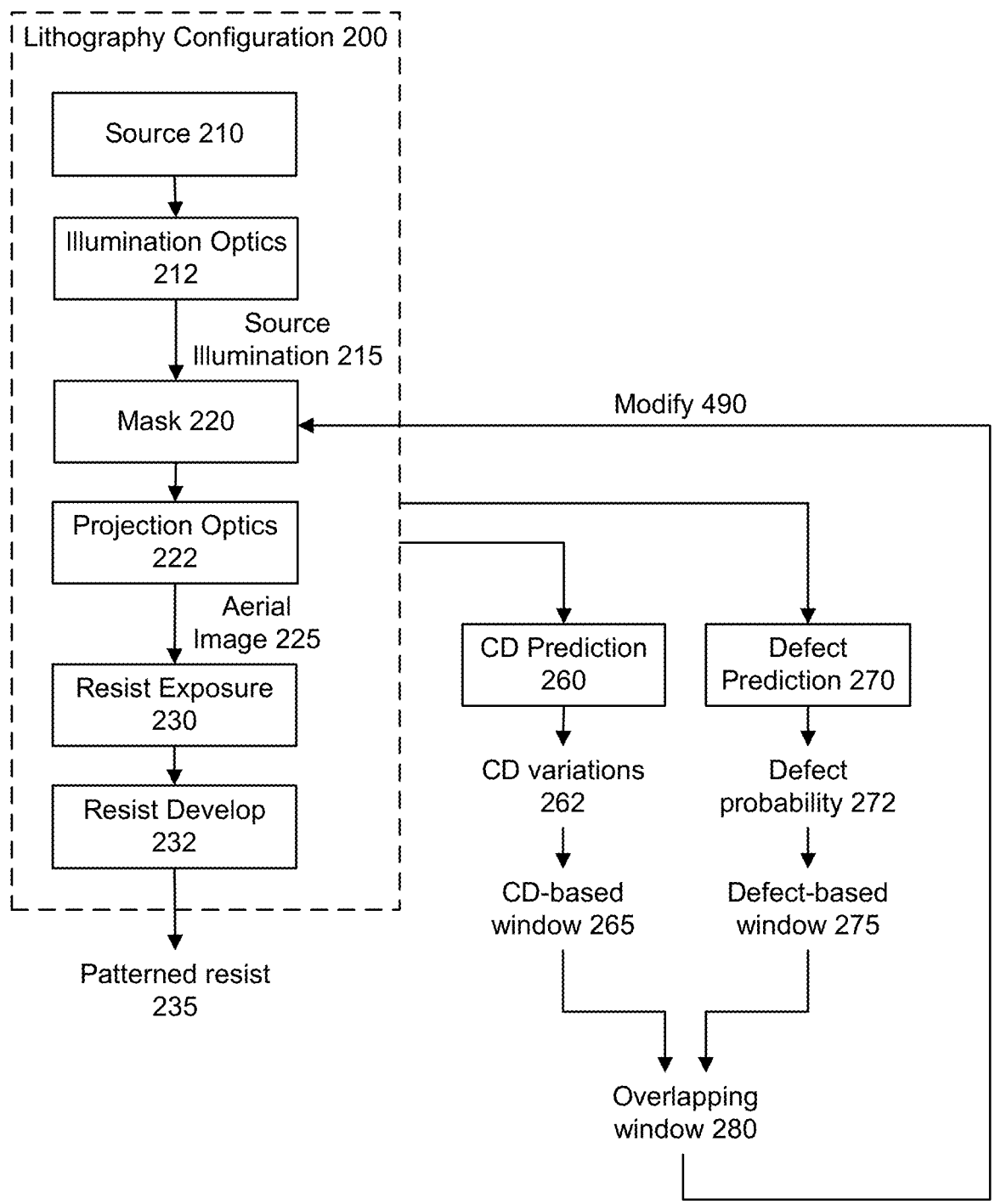
FIG. 4 depicts a flowchart for improving a lithography system based on optimizing a mask.

FIGS. 3 and 4 depict different types of improvements to the lithography configuration. In FIG. 3, the source illumination 215 is modified, for example by modifying 390 the source 210. In one approach, the defect probability model is used in source mask optimization (SMO) to optimize the source shape to prevent defects. A cost function is used with SMO to drive the source shape to reduce defectivity on the wafer. This can be achieved by building a final source shape that allows more photons (higher exposure energy) to achieve the desired CD. The probability of a defect is inversely proportional to the number of photons. However, the CD will change with number of photons also, so the source will have to account for these two effects.

Once a source is chosen, it is also possible to then further optimize other parts of the lithography configuration, for example the mask. This may be achieved through optical proximity correction (OPC), sub-resolution assist features (SRAF) and/or phase shifting (in the case of phase shifting masks). As shown in FIG. 4, these mask optimization techniques may also be used to modify 490 the mask, independently of the source optimization.

In these optimization cases, a cost function may be used to reduce the probability of a defect occurring. For example, the probability of a defect occurring may be improved from 3 sigma to 5 sigma.

In FIGS. 2-4, the defect probability 272 may be calculated in different ways. In one approach, the probability distribution for occurrence of defects on the wafer is calculated using a probability distribution for a stochastic variation in the lithography configuration. For example, the photon counts may have a known distribution depending on the total number of photons per area. A simulation may predict the average number of photons exposing the resist and then this may be overlaid with the probability distribution based on the average number of photon counts. A similar approach may be used for other stochastic variations. The probability distribution may be based on first principles, heuristic approximations, or empirical observations.

Alternatively, different components in modeling of the lithography configuration 200 may have stochastic components and these may be propagated through the simulation. For example, assume all stochastic components have Gaussian distributions. Then the probability distribution at different points in the simulation may be tracked by calculating the mean and variance at that point in the simulation. If the source 210 has a certain mean and variance, and the effect of the illumination optics 212 is known, then the mean and variance of the source illumination 215 can be calculated. Different components can also be stochastic in their own right. For example, scattering from mask 220 may have some stochastic variation, which is added to the source illumination 215.

Figure 5:
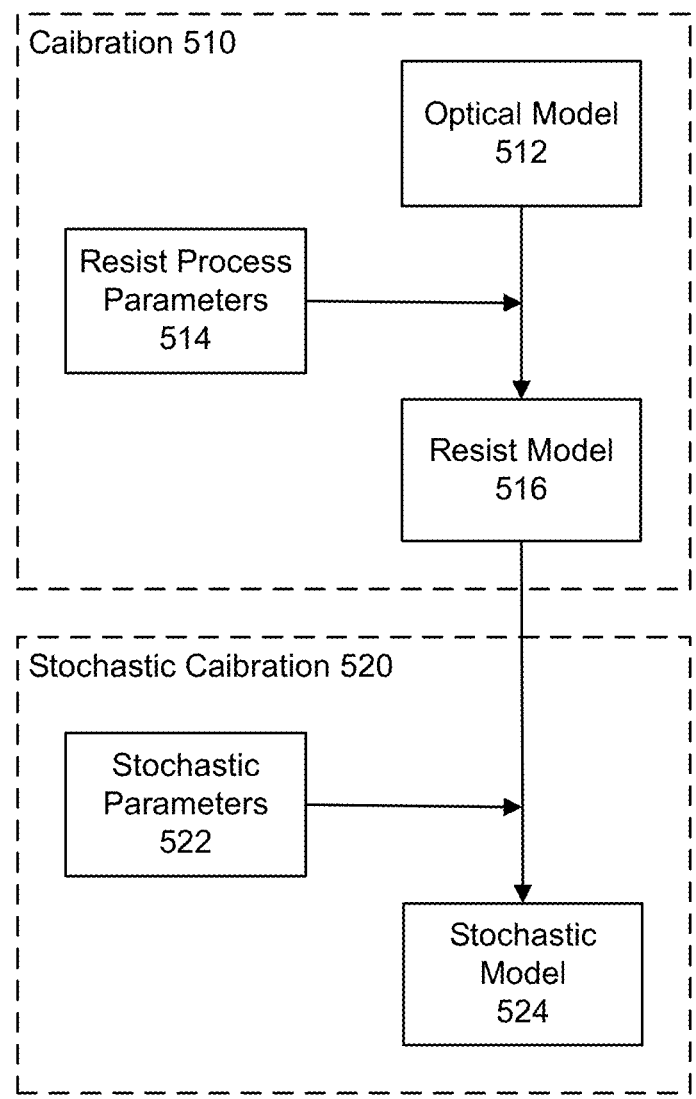
FIG. 5 depicts a flowchart for creating a stochastic model.

FIG. 5 depicts a flowchart of one examples for creating a stochastic model. As shown, during the first calibration 510, parameters 514 of the resist process are used with the optical model 512 to generate a resist model 516. During a stochastic calibration 520, stochastic parameters 522 together with the resist model 516 are used to generate a stochastic model 524. In some embodiments, the optical model 512 and the resist model 516 determine an optical signal intensity and an optical signal threshold associated with an optical signal. In some embodiments, the stochastic model 524 obtains the determined optical signal intensity and the determined optical signal threshold associated with the optical signal. Alternatively, in some embodiments, the stochastic model 524 determines the optical signal intensity and the optical signal threshold.

In some embodiments, extracting an optical signal contour using an optical signal threshold is performed. Extracting the optical signal contour can be performed stochastically. Generally, a contour line for a function of two variables, such as an optical signal intensity, I(x), and a point on a surface at which the optical signal is arriving, x, is a curve along which the function has a constant value, so that the curve joins points of equal value. In some embodiments, the optical signal contour is a plane section of the two-dimensional graph of the function I(x) parallel to the x-plane. In some embodiments, a signal field associated with the optical signal is created. Afterwards, an optical signal threshold for pattern transfer associated with the optical signal is determined. In some embodiments, the optical signal threshold is a constant number. In some embodiments, the optical signal threshold is defined by a number of photons that are expected to arrive at a point, i.e., a cutoff dose, divided by a dose associated with an area. For example, if the optical signal threshold is 0.2 and the dose associated with an area is 20 photons per square nanometer, then a probability that a specific area with a cross-section of one square nanometer receives less, or more than, a cutoff dose of 4 photons (i.e., 20*0.2) indicates an uncertainty on formation of an edge on the specific area. In some embodiments, the edge does not have infinite slope and curvature at an optical signal threshold location, which once correlation effects of adjacent voxels, i.e., three-dimensional pixels, are considered, results in a possible finite blurring. As an example, for a positive tone development, an optical signal above the optical signal threshold is assumed to be cleared, and an optical signal below the optical signal threshold is assumed to remain intact.

Further details may be found in U.S. Provisional Appl. Nos. 62/980,913 "Stochastic Signal Prediction in Compact Modeling" and 63/035,468 "Calibrating Stochastic Signals in Compact Modeling," which are incorporated by reference herein.

In yet another approach, the probability distributions for the defects may be developed using Monte Carlo methods.

Figure 6A:
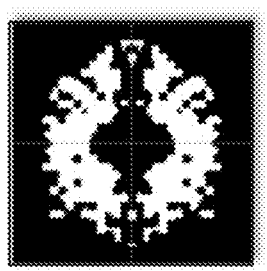
FIGS. 6A-6C depict an example of source mask optimization using a CD-based process window and a defect-based process window.
Figure 6A:
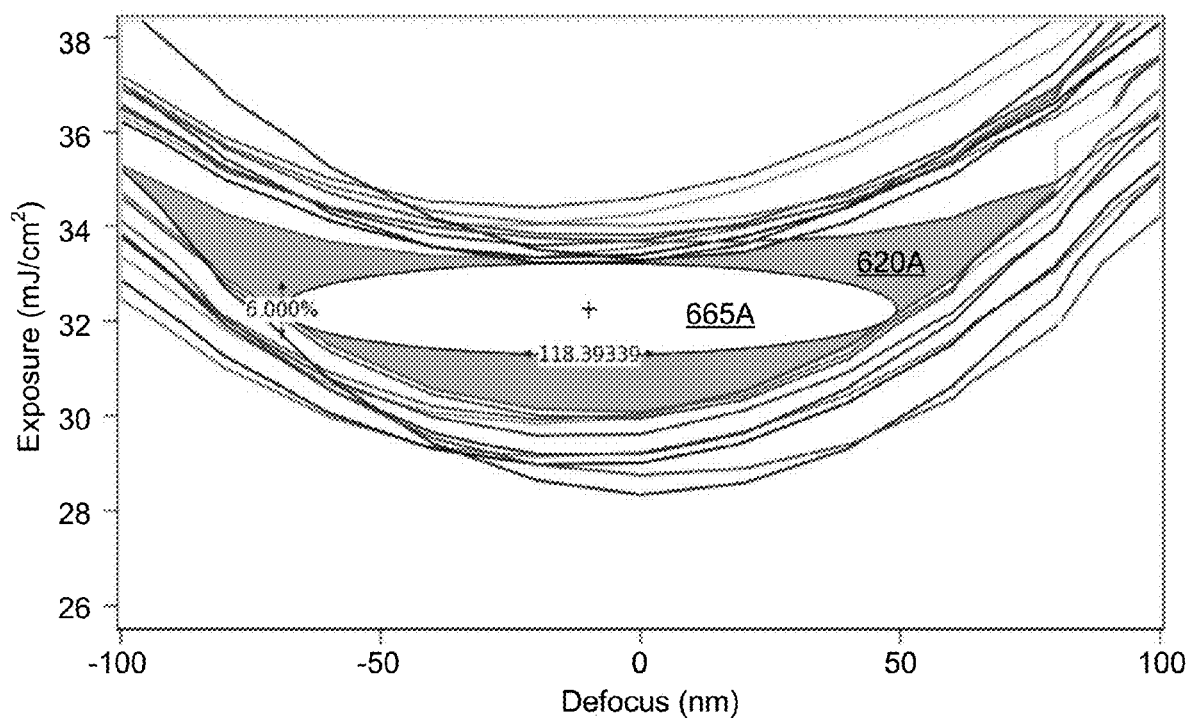
Figure 6B:
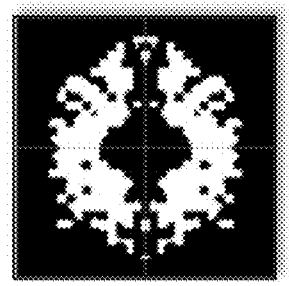
Figure 6B:
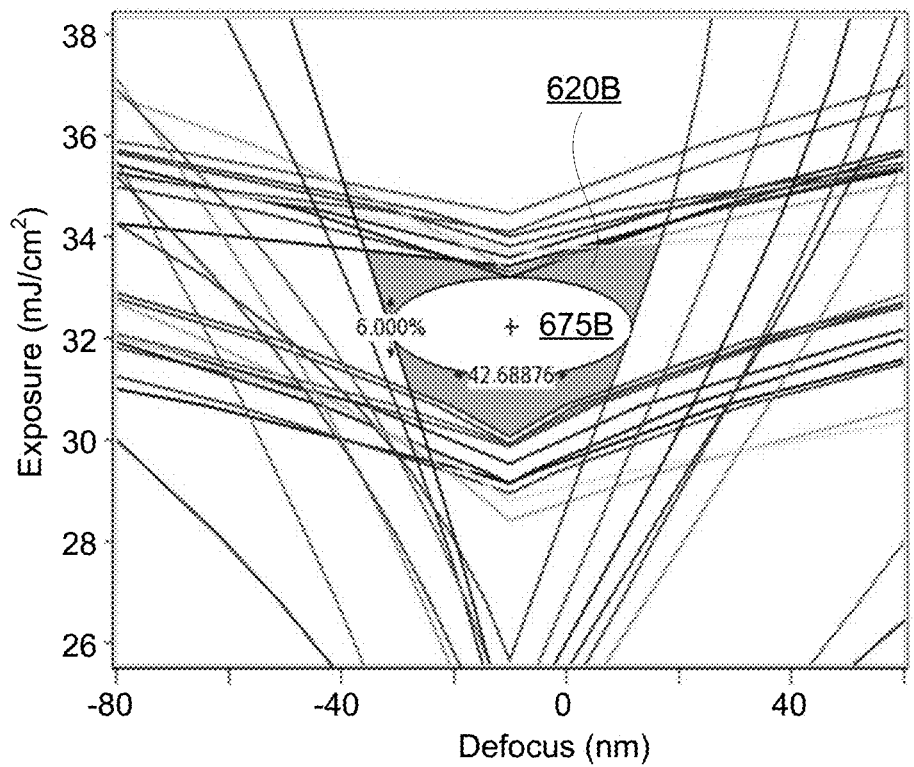
Figure 6C:
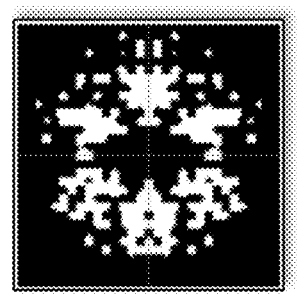
Figure 6C:
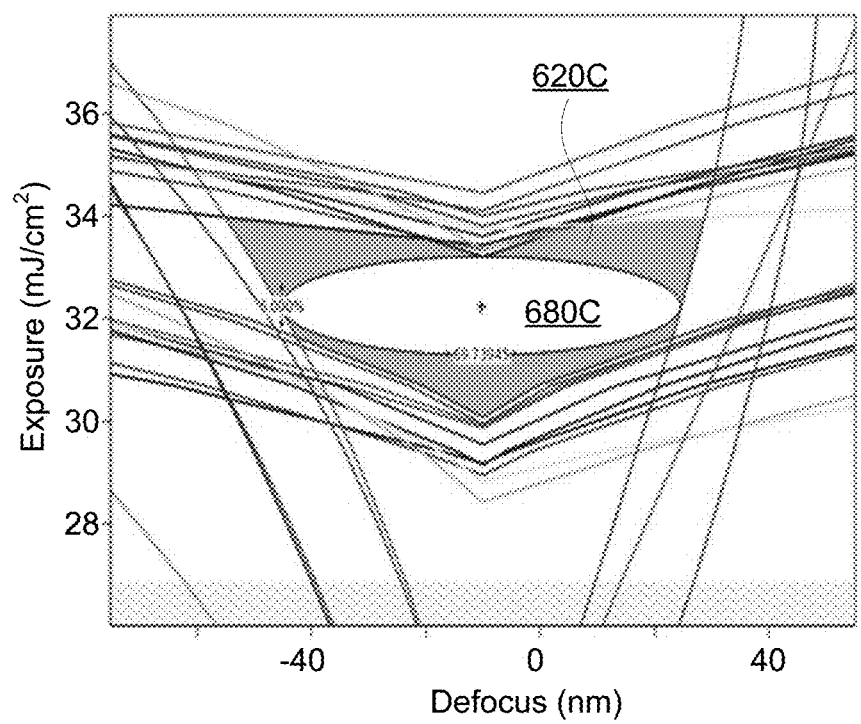

FIGS. 6A-6C depict an example of source mask optimization using the techniques described above. Each figure shows a different situation, progressing from FIG. 6A to FIG. 6C. Within each figure, the smaller black and white image is the source mask 610. The main color image plots different quantities as a function of defocus (x-axis) and exposure latitude (y-axis).

FIG. 6A shows a situation after source mask optimization has been performed, but considering only CD effects and not stochastic defects. The resulting source mask 610A is shown. FIG. 6A plots pairs of same-color curves where the band between the two curves is the area of acceptable CD variations. The teal color region 620A represents the overall acceptable process window for all curves, since it falls within the interior band for all pairs of curves. The oval 665A is a best fit oval inscribed within the teal region 620A. It has exposure latitude of 6% and depth of focus of 118 nm, but it represents only the CD-based process window.

FIG. 6B shows the defect-based process window for the same situation as FIG. 6A. The mask 610A is the same as in FIG. 6B. The pairs of curves from FIG. 6A are not shown for clarity. The new color curves in FIG. 6B represent areas of acceptable defect probabilities. The teal color region 620B represents the overall acceptable process window for all curves, since it falls within the acceptable band for all color curves. The oval 675B is a best fit oval inscribed within the teal region 620B. It has exposure latitude of 6% and depth of focus of 43 nm. This is much smaller than the process window 680A of FIG. 6A, but it is the actual process window for source mask 610A because it accounts also for defects.

FIG. 6C shows the situation when the source mask is optimized considering both CD effects and stochastic defects. For convenience, only the colors curves for defect probabilities are shown. The CD color curves are not shown because they are not as limiting. The resulting source mask 610C is different than before. However, the overall process window 680C has exposure latitude of 6% and depth of focus of 70 nm, which is significantly larger than the useable process window from FIGS. 6A and 6B.

Figure 7:
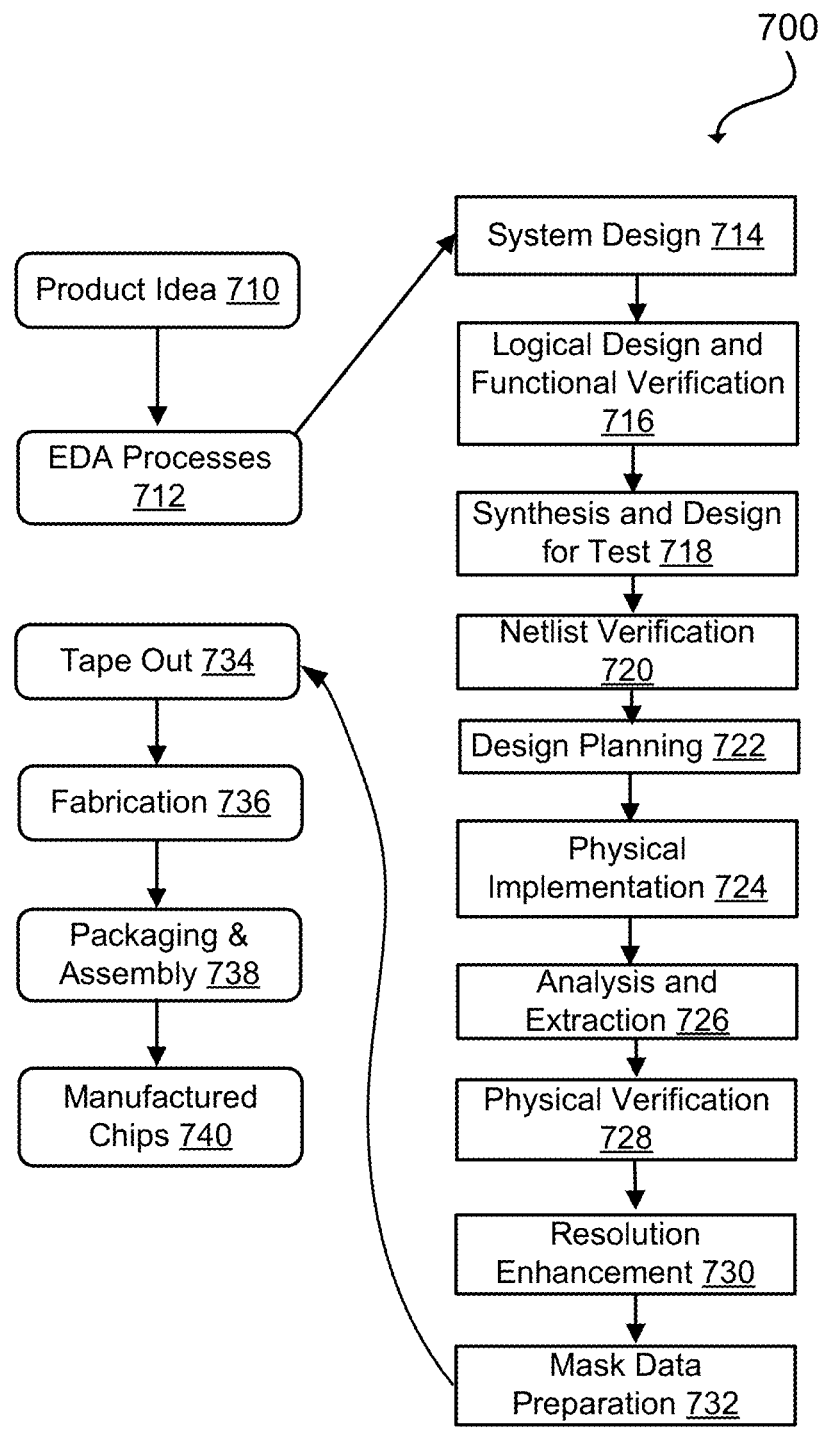
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
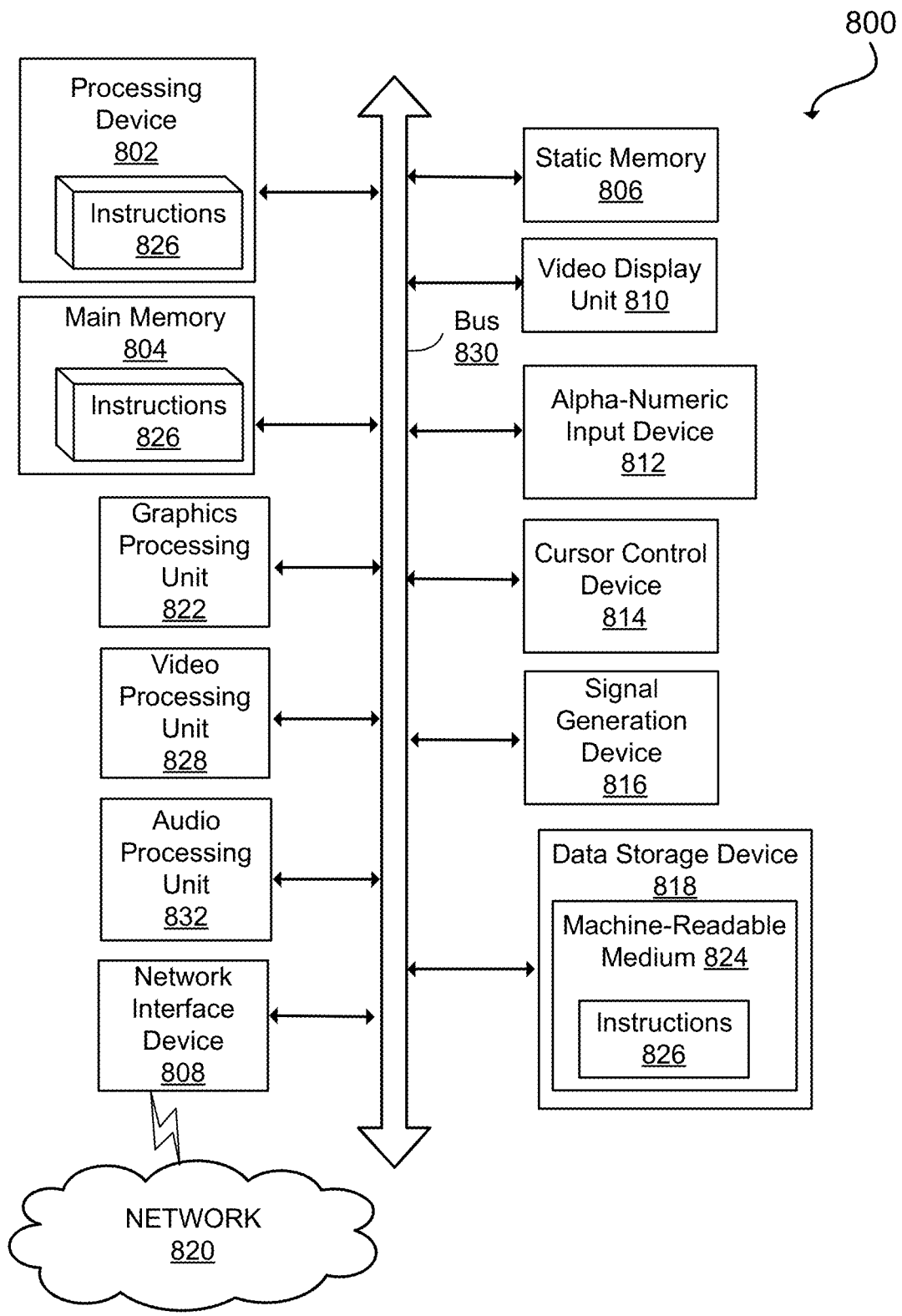
FIG. 8 depicts an abstract diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for improving a lithography configuration comprising a source illuminating a mask to expose resist on a wafer, the method comprising:
   determining, by a processor, a defect-based focus exposure window (FEW) based on a predicted probability distribution for occurrence of defects on the wafer, wherein the defect-based FEW is an area of depth of focus and exposure latitude for the lithography configuration with an acceptable level of defects on the wafer,
   determining, by a processor, a critical dimension (CD)-based FEW based on predicted CDs on the wafer; wherein the CD-based FEW is an area of depth of focus and exposure latitude for the lithography configuration with an acceptable level of CD variation on the wafer; and
   modifying the lithography configuration based on increasing an area of overlap between the defect-based FEW and the CD-based FEW.

2. The method of claim 1 wherein determining the defect-based FEW is based on a defectivity rate for the wafer, and the defectivity rate for the wafer is determined based on the predicted probability distribution for occurrence of defects on the wafer.

3. The method of claim 1 wherein the lithography configuration operates at an extreme ultraviolet (EUV) wavelength range and the probability distribution for occurrence of defects on the wafer is a result of a stochastic variation in photons exposing the resist.

4. The method of claim 1 wherein the probability distribution for occurrence of defects on the wafer is calculated using a probability distribution for a stochastic variation in the lithography configuration.

5. The method of claim 1 wherein the probability distribution for occurrence of defects on the wafer is calculated using a Monte Carlo simulation of the lithography configuration.

6. The method of claim 1 further comprising predicting the probability distribution for occurrence of defects on the wafer, wherein predicting the probability distribution for the occurrence of defects comprises:
   determining a contour for an optical signal exposing the resist, wherein the optical signal is characterized by a probability distribution;
   defining a first parameter based at least in part on an intensity of the optical signal;
   defining a second parameter indicative of a fraction of the optical signal absorbed by the resist; and
   predicting the probability distribution for the occurrence of defects based at least in part on the optical signal contour, and the first and second parameters.

7. The method of claim 1 wherein modifying the lithography configuration comprises:
   improving an alignment of the defect-based FEW and the CD-based FEW.

8. The method of claim 1 wherein modifying the lithography configuration comprises:
   modifying at least one of the source and the mask based on increasing the area of overlap between the defect-based FEW and the CD-based FEW.

9. The method of claim 8 wherein modifying the mask further comprises:
   using at least one of sub-resolution assist features and optical proximity correction to modify the mask.

10. The method of claim 8 wherein the mask includes phase shifting elements, and modifying the mask further comprises:
    modifying the phase shifting elements based on increasing the area of overlap between the defect-based FEW and the CD-based FEW.

11. The method of claim 1 wherein the lithography configuration operates at an extreme ultraviolet (EUV) wavelength range and at a technology node with feature sizes of 14 nm or smaller.

12. The method of claim 1 wherein modifying the lithography configuration comprises:
    defining a cost function that is a function of the area of overlap between the defect-based FEW and the CD-based FEW; and
    modifying the lithography configuration based on improving the cost function.

13. A system for improving a lithography configuration comprising a source illuminating a mask to expose resist on a wafer comprising:
    a memory storing instructions; and
    a processor, coupled with the memory and to execute the instructions, the instructions when executed cause the processor to:
       determine a defect-based focus exposure window (FEW) based on a predicted probability distribution for occurrence of defects on the wafer, wherein the defect-based FEW is an area of depth of focus and exposure latitude for the lithography configuration with an acceptable level of defects on the wafer,
       determine a critical dimension (CD)-based FEW based on predicted CDs on the wafer; wherein the CD-based FEW is an area of depth of focus and exposure latitude for the lithography configuration with an acceptable level of CD variation on the wafer; and
       modify the lithography configuration based on increasing an area of overlap between the defect-based FEW and the CD-based FEW.

14. The system of claim 13, wherein the lithography configuration operates at an extreme ultraviolet (EUV) wavelength range and the probability distribution for occurrence of defects on the wafer is a result of a stochastic variation in photons exposing the resist.

15. The system of claim 13, wherein the lithography configuration operates at an extreme ultraviolet (EUV) wavelength range and at a technology node with feature sizes of 14 nm or smaller.

16. A non-transitory computer readable medium comprising stored instructions for improving a lithography configuration comprising a source illuminating a mask to expose resist on a wafer, which when executed by a processor, cause the processor to:
    determine a defect-based focus exposure window (FEW) based on a predicted probability distribution for occurrence of defects on the wafer, wherein the defect-based FEW is an area of depth of focus and exposure latitude for the lithography configuration with an acceptable level of defects on the wafer,
    determine a critical dimension (CD)-based FEW based on predicted CDs on the wafer; wherein the CD-based FEW is an area of depth of focus and exposure latitude for the lithography configuration with an acceptable level of CD variation on the wafer; and
    modify the lithography configuration based on increasing an area of overlap between the defect-based FEW and the CD-based FEW.

17. The non-transitory computer readable medium of claim 16 wherein modifying the lithography configuration comprises:
   improving an alignment of the defect-based FEW and the CD-based FEW.

18. The non-transitory computer readable medium of claim 16 wherein modifying the lithography configuration comprises:
   modifying at least one of the source and the mask based on increasing the area of overlap between the defect-based FEW and the CD-based FEW.

19. The non-transitory computer readable medium of claim 16 wherein modifying the lithography configuration is based on improving an alignment of the defect-based FEW and the CD-based FEW.

20. The non-transitory computer readable medium of claim 16 wherein modifying the lithography configuration is based on increasing the area of the defect-based FEW and/or the area of the CD-based FEW.

* * * * *